: US006117785A

United States Patent [19]
Lee et al.

[11] Patent Number: 6,117,785
[45] Date of Patent: Sep. 12, 2000

[54] MULTIPLE ETCH METHODS FOR FORMING CONTACT HOLES IN MICROELECTRONIC DEVICES INCLUDING SOG LAYERS AND CAPPING LAYERS THEREON

[75] Inventors: Hae-jeong Lee, Kyungki-do; Ji-hyun Choi, Seoul; Byung-keun Hwang; Ju-seon Goo, both of Kyungki-do, all of Rep. of Korea

[73] Assignee: Samsung Electronics Co., Ltd., Rep. of Korea

[21] Appl. No.: 08/891,360

[22] Filed: Jul. 10, 1997

[30] Foreign Application Priority Data

Sep. 13, 1996 [KR] Rep. of Korea ............ 96-39855

[51] Int. Cl.⁷ .................................................. H01L 21/31
[52] U.S. Cl. .................. 438/700; 438/673; 438/640; 438/782; 438/701; 438/713
[58] Field of Search .................................. 438/636, 952, 438/640, 673, 701, 713, 700, 782, 624

[56] References Cited

U.S. PATENT DOCUMENTS

| | | | |
|---|---|---|---|
| 5,308,415 | 5/1994 | Chou | 438/714 |
| 5,432,073 | 7/1995 | Wu et al. | 438/624 |
| 5,538,922 | 7/1996 | Cooper et al. | 438/634 |
| 5,686,337 | 11/1997 | Koh et al. | 438/240 |
| 5,719,416 | 2/1998 | Yoshimori et al. | 257/295 |
| 5,883,002 | 3/1999 | Shih et al. | 438/640 |

*Primary Examiner*—Charles Bowers
*Assistant Examiner*—Thanh Nguyen
*Attorney, Agent, or Firm*—Myers Bigel Sibley & Sajovec

[57] ABSTRACT

A method for forming a microelectronic device includes the steps of forming a spin-on-glass layer on a microelectronic substrate, and forming a capping layer on the spin-on-glass layer opposite the substrate. A masking layer is formed on the capping layer opposite the substrate wherein the masking layer exposes portions of the capping layer and the spin-on-glass layer. The exposed portions of said capping layer and the spin-on-glass layer are etched using the masking layer as an etch mask to thereby form a contact hole through the capping layer and the spin-on-glass layer wherein protruding edge portions of the capping layer extend beyond the spin-on-glass layer adjacent the contact hole. The mask layer is removed, and the protruding edge portions of the capping layer are removed from adjacent the contact hole.

10 Claims, 3 Drawing Sheets

MULTIPLE ETCH METHODS FOR FORMING CONTACT HOLES IN MICROELECTRONIC DEVICES INCLUDING SOG LAYERS AND CAPPING LAYERS THEREON

FIELD OF THE INVENTION

The present invention relates to the field of semiconductor devices and more particularly to methods for forming contact holes for semiconductor devices.

BACKGROUND OF THE INVENTION

As dynamic random access memory (DRAM) devices become more highly integrated, the space available for each memory cell is reduced. Accordingly, three-dimensional memory cell capacitor structures have been developed to provide a desired capacitance on a reduced surface area. Accordingly, a memory cell may have a height over the substrate of 1 μm or higher. This height, however, may result in a substantial step difference between a cell array region of the DRAM and a peripheral circuit region of the DRAM. Irregular reflections may thus occur in subsequent photolithography steps thereby reducing the exposure resolution.

Accordingly, interdielectric layers providing high degrees of planarization are desired. For example, an interdielectric layer can be formed from a layer of borophosphosilicate glass (BPSG), and the borophosphosilicate glass layer can be reflowed to provide a planar surface. Alternately, an interdielectric layer can be formed from a layer of 03-tetraethyl orthosilicate undoped silicate class (03-TEOS USG), and this layer can be etched back to provide a planar surface.

When reflowing a BPSG layer, however, the DRAM may be heated to a temperature of 850° C. for 30 minutes or longer. In DRAMs with a capacity of 256 Mb or higher, TaO or BST may be used to provide the capacitor dielectric layers, and a high temperature reflow step may damage these dielectric layers. Accordingly, it may be desirable to avoid the high temperature reflow step. The etch back used to planarize a layer of 03-TEOS USG may result in relatively complicated processing steps. In addition, the BPSG and 03-TEOS USG layers may be unable to provide sufficient planarization.

In response, spin-on-glass (SOG) layers have been used to provide planarized interdielectric layers. Spin-on-glass layers can be used to provide a high degree of planarization without requiring complex processing steps or high temperature steps. When using a layer of a spin-on-glass as an interdielectric layer, however, the wet etch rate and the hygroscopicity of the spin-on-glass layer should be reduced using a heat treatment. In particular, a wet etch may be used to remove a native oxide layer when depositing a conductive layer after forming a contact hole through the spin-on-glass layer. If the wet etch rate of the spin-on-glass layer is too high, the size of the contact hole may increase excessively. Furthermore, if the hygroscopicity of the spin-on-glass layer is too high, the dielectric constant of the spin-on-glass layer may be too high thereby resulting in malfunctions for the DRAM device.

A capping layer on the spin-on-glass layer can be used to reduce the absorption of moisture into the spin-on-glass layer thereby reducing problems relating to hygroscopicity. The spin-on-glass layer is thus formed on the substrate, the memory cell access transistor, and the bit line, and the spin-on-glass layer is baked at a temperature of 750° C. or less. A capping layer is then formed on the spin-on-glass layer to reduce the absorption of water into the spin-on-glass layer. The step of baking the spin-on-glass layer evaporates solvents from the spin-on-glass layer thereby leaving a solid layer having properties similar to those of $SiO_2$. The resulting structure including the spin-on-glass layer and the capping layer can then be annealed at a temperature of 550° C. or higher.

The wet etch rate of the spin-on-glass layer, however, may be higher than that of the capping layer. When forming contact holes through the capping layer and the spin-on-glass layer, the profiles of the resulting contact holes may thus be degraded. In particular, a wet etch used to form the contact holes may undercut the capping layer adjacent the contact hole because of the difference in etch rates. Accordingly, voids may result when depositing a conductive via in the contact hole.

In particular, an oxide layer formed by plasma enhanced chemical vapor deposition (PECVD) can be used to form the capping layer, and this oxide layer may have a lower etch rate than a spin-on-glass layer. Accordingly, when etching contact holes through the capping layer and the spin-on-glass layer, the etch may undercut the capping layer so that protruding edge portions of the capping layer extend beyond the spin-on-glass layer adjacent the contact hole. As discussed above, voids may thus result when forming a conductive via in the contact hole.

Accordingly, there continues to exist a need in the art for improved methods for forming contact holes for semiconductor devices.

SUMMARY OF THE INVENTION

It is therefore an object of the present invention to provide improved method for forming contact holes for highly integrated microelectronic devices.

It is another object of the present invention to provide methods for forming contact holes having improved profiles.

These and other objects are provided according to the present invention by methods including the steps of forming a spin-on-glass layer on a microelectronic substrate and forming a capping layer on the spin-on-glass layer opposite the substrate. A contact hole is formed through the capping layer and the spin-on-glass layer wherein protruding edge portions of the capping layer extend beyond the spin-on-glass layer adjacent the contact hole. The protruding edge portions of the capping layer are then removed from adjacent the contact hole. Accordingly, the profile of the contact hole can be improved so that the formation of voids can be reduced when forming a conductive via in the contact hole.

In particular, a spin-on-glass layer is formed on a microelectronic substrate, and a capping layer is formed on the spin-on-glass layer opposite the substrate. A masking layer is formed on the capping layer opposite the substrate wherein the masking layer exposes portions of the capping layer and the spin-on-glass layer. The exposed portions of the capping layer and the spin-on-glass layer are then etched using the masking layer as an etch mask to thereby form a contact hole through the capping layer and the spin-on-glass layer wherein protruding edge portions of the capping layer extend beyond the spin-on-glass layer adjacent the contact hole. The masking layer is then removed, and the protruding edge portions of the capping layer are removed from adjacent the contact hole.

Moreover, the step of etching the exposed portion of the capping layer and the spin-on-glass layer can include wet and dry etching the capping layer and the spin-on-glass layer, and the step of removing the protruding edge portions of the capping layer can include argon ion etching the capping layer. In addition, the capping layer can be an oxide layer formed by plasma enhanced chemical vapor deposition. The capping layer can have a thickness of less than approximately 1000 Ångstroms, and the spin-on-glass layer can be a layer of hydrogen silsesquioxane (HSQ). Furthermore, the step of removing the protruding edge portions of the capping layer can include argon etching the capping layer to a thickness no greater than approximately 700 Ångstroms, and the method can also include the step of annealing the capping layer at a temperature of at least 550° C.

According to an alternate aspect of the present invention, a method can be provided for forming a microelectronic memory device. In particular, a memory cell access transistor is formed on a semiconductor substrate. The memory cell access transistor includes a channel region of the substrate between spaced apart source/drain regions at a surface of the substrate, a gate on the channel region of the substrate, and a bit line electrically connected to a first one of the source/drain regions. A spin-on-glass layer is formed on the substrate, on the gate, on the source/drain regions, and on the bitline, and a capping layer is formed on the spin-on-glass layer opposite the semiconductor substrate. A contact hole is formed through the capping layer and the spin-on-glass layer exposing a second one of the source/drain regions wherein protruding edge portions of the capping layer extend beyond the spin-on-glass layer adjacent the contact hole. The protruding edge portions of said capping layer are then removed from adjacent the contact hole.

According to the methods of the present invention, contact holes having improved profiles can be formed. Moreover, the generation of voids can be reduced when forming conductive vias in contact holes formed according to the present invention. Accordingly, improved microelectronic devices, and more particular, improved microelectronic memory devices can be provided.

DETAILED DESCRIPTION

Figure 1A:
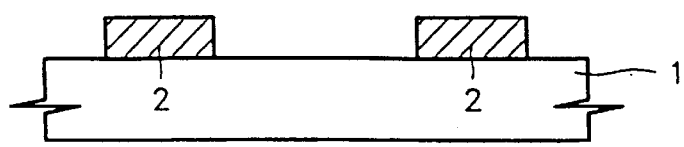
FIGS. 1A–1I are cross sectional views illustrating steps of a first method for forming a contact hole according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Steps of a first method for forming a contact hole for a semiconductor device according to the present invention are illustrated in FIGS. 1A through 1I. In particular, the method of the present invention can be used to provide contact holes for a highly integrated semiconductor device such as a dynamic random access memory (DRAM) device. For example, a DRAM includes a plurality of memory cells arranged in an array of rows and columns, and each memory cell includes a memory cell access transistor and a memory cell capacitor. Moreover, the memory cell access transistor includes a pair of spaced apart source/drain regions of the substrate separated by a channel region of the substrate, and a gate on said channel region. A first source/drain region is connected to a bit line, the gate is connected to a wordline, and the second source/drain region is connected to an electrode of the memory cell capacitor. An interdielectric layer can then be formed on the substrate and on the memory cells to provide planarization across cell array and peripheral circuit regions of the substrate.

Figure 1B:
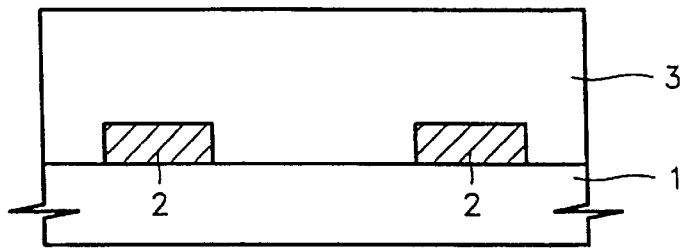

As shown in FIG. 1A, a circuit pattern 2 such as a gate, a bitline, and/or an S-poly, is formed on a semiconductor substrate 1. As shown in FIG. 1B, an interdielectric layer 3 is then formed on the semiconductor substrate 1 including the circuit patterns 2. In particular, spin-on-glass can be used as the interdielectric layer, and the spin-on-glass layer can be used to fill narrow spaces without generating voids. The spin-on-glass can be siloxane or silicate mixed with an alcoholic solvent, and this layer can be baked to evaporate solvents therein so that a solid layer remains. The properties of the resulting spin-on-glass layer are similar to those of a $SiO_2$ layer.

Either organic spin-on-glass or inorganic spin-on-glass can be used for the spin-on-glass layer. An organic spin-on-glass can be applied using relative simple process steps, and an organic spin-on-glass can provide a high degree of planarization as well as the adaptability of low-temperature heat treatment. An organic spin-on-glass, however, may include carbon and may generate cracks at temperatures of 600° C. and higher.

Alternately, an inorganic spin-on-glass such as hydrogen silsesquioxane (HSQ) can be used to provide a spin-on-glass layer with a thickness of 300 Ångstroms or more using a spin coating step. When baking a HSQ layer on a hot plate oven (HPO), the HSQ layer has a property of self-flow at a predetermined temperature so that HSQ provides a high degree of planarization and crack resistance so that the generation of cracks can be reduced at temperatures of 700° C. or higher. Accordingly, HSQ is preferably used to provide the spin-on-glass layer of the present invention.

HSQ is an inorganic spin-on-glass having a dielectric constant of approximately 3 after curing at 400° C. Unlike conventional inorganic spin-on-glass materials, an HSQ spin-on-glass layer having a thickness of 4000 Ångstroms or more can be obtained in a single coating step. In addition, HSQ spin-on-glass layers are sufficiently crack resistant that the generation of cracks in portions of a HSQ spin-on-glass layer covering large step differences can be reduced. This high degree of crack resistance can be maintained in layers of HSQ having thickness of 4000 Ångstroms or more. Furthermore, because HSQ spin-on-glass layers do not have significant amounts of carbon therein, HSQ spin-on-glass layers are rarely affected by $O_2$ plasmas used to strip photoresist.

Figure 1C:
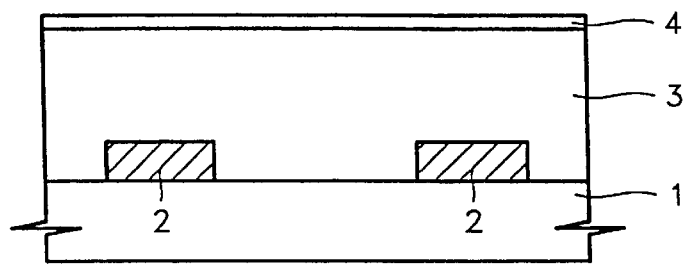

As discussed above, the HSQ spin-on-glass layer is coated on the substrate to provide the interdielectric layer, and the HSQ spin-on-glass layer is thermally treated at a temperature in the range of 400° C. to 450° C. for 30 to 60 minutes. The thermal treatment is used to stabilize the HSQ layer. A capping layer 4 having a thickness of 1000 Ångstroms or less is then formed on the HSQ spin-on-glass layer 3 as shown in FIG. 1C. In particular, the capping layer 4 can be a layer of oxide formed by an $O_2$ plasma deposition, a chemical vapor deposition (CVD), a plasma chemical vapor deposition (CVD), or a plasma enhanced chemical vapor deposition (PECVD).

Figure 1D:
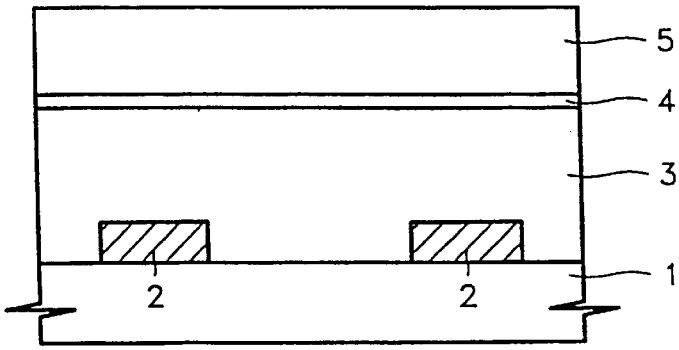
Figure 1E:
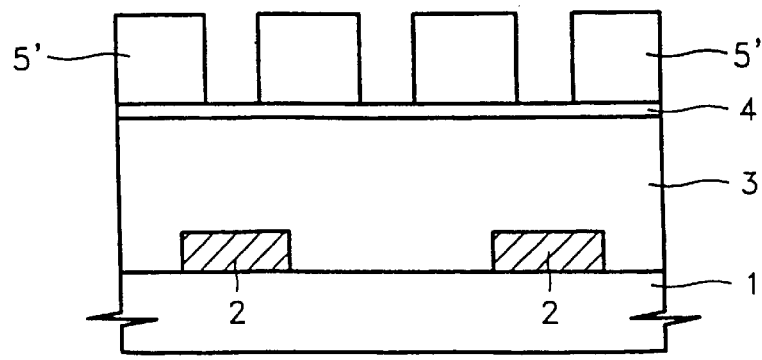
Figure 1F:
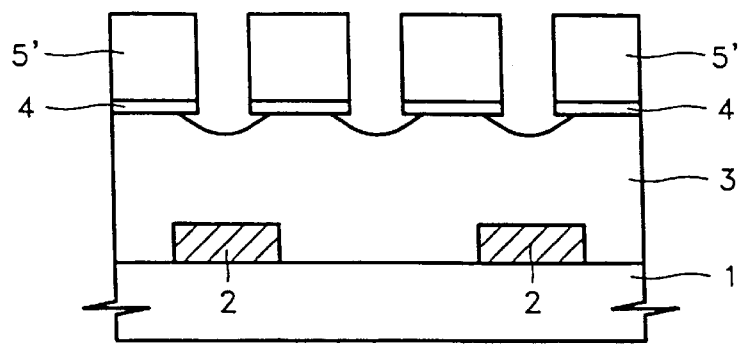
Figure 1G:
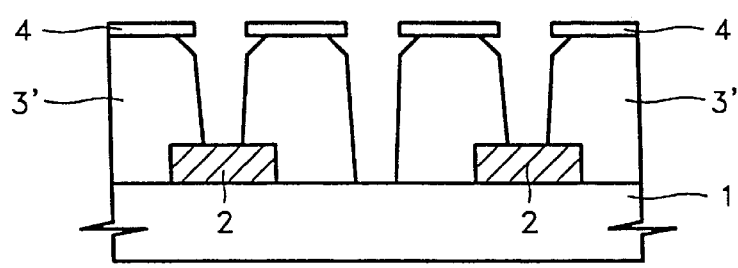

A photoresist layer 5 is then coated on the capping layer as shown in FIG. 1D, and patterned thereby exposing portions of the capping and spin-on-glass layers as shown in FIG. 1E. In particular, the photoresist layer can be patterned using alignment, exposure, and development steps known to those having skill in the art. Exposed portions of the capping and spin-on-glass layers are then wet etched as shown in FIG. 1F. Because the wet etch rate of the HSQ spin-on-glass layer is higher than the etch rate of the capping layer, a concave surface is formed under edge portions of the capping layer. In other words, the wet etch may undercut the capping layer so that protruding edge portions thereof extend beyond the spin-on-glass layer. A dry etch is then performed on the exposed portions of the spin-on-glass layer thereby exposing portions of the substrate, and the photoresist layer is removed as shown in FIG. 1G.

Figure 1H:
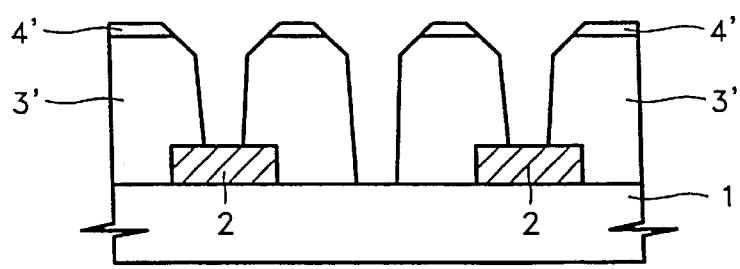
Figure 1I:
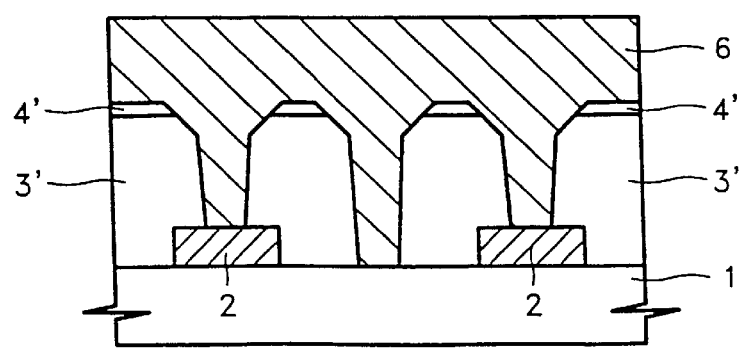

An argon ion etch step is then performed to remove the protruding edge portions of the capping layer as shown in FIG. 1H so that contact holes having smooth profiles are formed. The argon ion etch can reduce the thickness of the remaining capping layer to 700 Ångstroms or less. A metal layer 6 can then be formed on the capping layer and on the exposed portions of the substrate in the contact holes previously formed as shown in FIG. 1I. In particular, the metal layer can be formed using an electron cyclotron resonance (ECR) technique, and the occurrence of voids is reduced because contact holes have a smooth profile.

Figure 2A:
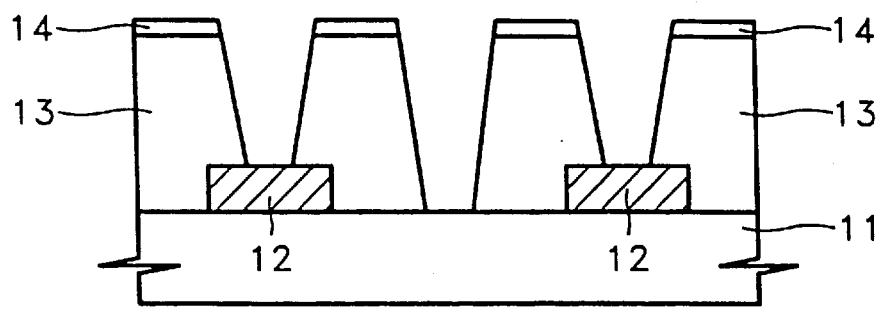
FIGS. 2A–2C are cross sectional views illustrating steps of a second method for forming a contact hole according to the present invention.
Figure 2B:
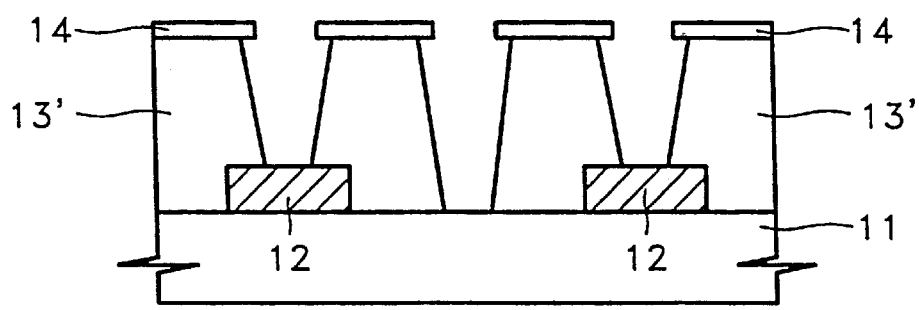
Figure 2C:
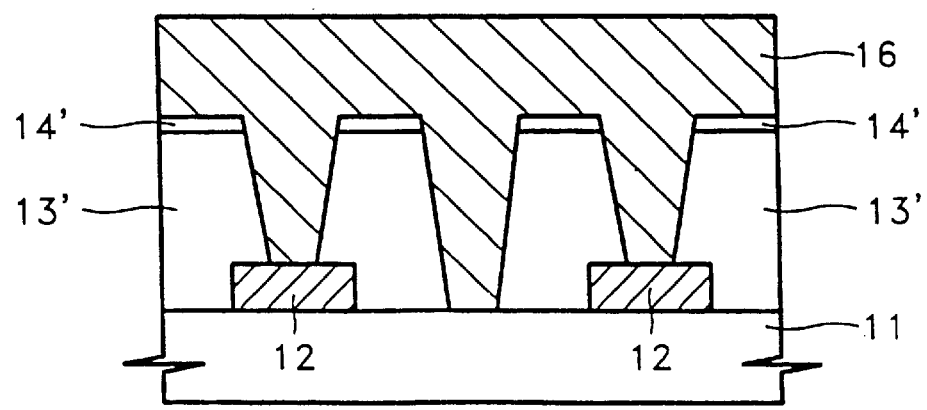

Steps of a second method for forming contact holes according to the present invention are illustrated in FIGS. 2A through 2C. In this second method, the contact holes are formed by dry etching the capping and spin-on-glass layers which is followed by a wet contact hole clean. As shown in FIG. 2A, circuit patterns 12 are formed on a semiconductor substrate 11, and the HSQ spin-on-glass layer 13 and the capping layer 14 are formed on the substrate and circuit patterns. Contact holes are then formed in the capping and HSQ spin-on-glass layers thereby exposing portions of the substrate and/or circuit patterns. In particular, the contact holes are formed using a dry etch step.

A wet contact hole clean is then performed as shown in FIG. 2B. Accordingly, the wet contact hole clean may undercut the capping layer so that protruding edge portions thereof extend beyond the HSQ spin-on-glass layer adjacent the contact holes. The protruding edge portions of the capping layer are then removed by performing an argon ion etch in-situ so that the capping layer has a thickness of approximately 700 Ångstroms or less. The profile of the contact holes is thus made smooth as shown in FIG. 2C. Accordingly, the metal layer 16 can be formed on the capping layer and on the exposed portions of the substrate in the contact holes without generating voids as shown in FIG. 2C.

The methods of the present invention discussed above include a metal interconnection on an interlayer dielectric (ILD). As will be understood by those having skill in the art, the methods of the present invention can also be used to provide contact holes through intermetallic dielectric (IMD) layers formed between metal interconnections. As discussed above, contact holes through capping and spin-on-glass layers having smooth profiles can be provided even if a wet etch is used. Accordingly, metal via contacts can be formed in the contact holes while reducing the generation of voids therein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a microelectronic device, said method comprising the steps of:

forming a spin-on-glass layer on a microelectronic substrate wherein said spin-on-glass layer comprises a layer of hydrogen silsesquioxane (HSQ);

forming a capping layer on said spin-on-glass layer opposite said microelectronic substrate;

forming a masking layer on said capping layer opposite said substrate wherein said masking layer exposes a portion of said capping layer;

etching successively said exposed portion of said capping layer and said spin-on-glass layer using said masking layer as an etch mask to thereby form a contact hole through said capping layer and said spin-on-glass layer wherein protruding edge portions of said capping layer extend beyond said spin-on-glass layer adjacent said contact hole; and removing said protruding edge portions of said capping layer from adjacent said contact hole.

2. A method according to claim 1 wherein said step of etching said exposed portion of said capping layer and said spin-on-glass layer comprises wet and dry etching said capping layer and said spin-on-glass layer.

3. A method according to claim 1 wherein said step of removing said protruding edge portions of said capping layer comprises argon ion etching said capping layer.

4. A method according to claim 1 wherein said step of forming said capping layer comprises forming an oxide layer.

5. A method according to claim 4 wherein said capping layer comprises a plasma enhanced chemical vapor deposited oxide.

6. A method according to claim 1 wherein said capping layer has a thickness no greater than approximately 1000 Ångstroms.

7. A method according to claim 1 wherein said step of removing said protruding edge portions of said capping layer comprises argon etching said capping layer to a thickness no greater than approximately 700 Ångstroms.

8. A method according to claim 1 further comprising the step of annealing the capping layer at a temperature of at least 550° C.

9. A method according to claim 1 wherein said step of etching said exposed portion of said capping layer and said spin-on-glass layer comprises the steps of:

dry etching said exposed portions of said capping layer and said spin-on-glass layer to form said contact hole; and wet cleaning said contact holes wherein said wet cleaning undercuts said capping layer thereby forming said protruding edge portions of said capping layer.

10. A method according to claim 1 wherein said step of removing said protruding edge portions is followed by the step of forming a conductive via in said contact hole.

* * * * *